United States Patent
Von Dolteren, Jr.

(10) Patent No.: US 6,603,362 B2
(45) Date of Patent: *Aug. 5, 2003

(54) SUBSAMPLING DIGITIZER-BASED FREQUENCY SYNTHESIZER

(75) Inventor: George E. Von Dolteren, Jr., Palm Bay, FL (US)

(73) Assignee: Intersil Americas Inc., Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/524,992

(22) Filed: Mar. 14, 2000

(65) Prior Publication Data

US 2002/0084856 A1 Jul. 4, 2002

(51) Int. Cl.[7] .................................................. H03L 7/00
(52) U.S. Cl. .......................... 331/25; 331/12; 331/16; 375/376; 327/107; 327/159; 327/156
(58) Field of Search ............................ 331/12, 1 A, 17, 331/16, 25; 327/107, 159, 156; 375/376

(56) References Cited

U.S. PATENT DOCUMENTS 5,444,420 A * 8/1995 Wernlund ................... 331/1 R
5,838,749 A   11/1998 Casper et al. ................ 375/376
6,252,464 B1 * 6/2001 Richards et al. ............. 331/4

* cited by examiner

*Primary Examiner*—Arnold Kinkead
(74) *Attorney, Agent, or Firm*—Allen, Dyer, Doppelt, Milbrath & Gilchrist, P.A.

(57) ABSTRACT

A reduced phase noise multiplication, digitally controlled frequency synthesizer employs a subsampling digitizer to downconvert (perform 'constructive aliasing' of) the synthesizer's output frequency to baseband for precision tuning of the synthesizer's output frequency in a digitally controlled phase locked loop. The use of a digitally controlled phase locked loop allows the stepsize of the synthesizer output frequency to be controlled in very small (e.g., sub-Hertz) increments. Since the phase locked loop uses all digital components for tuning control, no additional frequency division by the loop is required. This means that only the value of the subharmonic ratio 'n' of the subsampling clock to the analog-to-digital converter will determine multiplicative phase noise error.

5 Claims, 4 Drawing Sheets

# SUBSAMPLING DIGITIZER-BASED FREQUENCY SYNTHESIZER

FIELD OF THE INVENTION

The present invention relates in general to communication systems, and is particularly directed to a new and improved digitally controlled frequency synthesizer that employs a subsampling digitizer to downconvert the synthesizer's output frequency to baseband for precision tuning of the synthesizer's output frequency in a digitally controlled phase locked loop.

BACKGROUND OF THE INVENTION

FIG. 1 diagrammatically illustrates a conventional frequency synthesizer that employs a phase locked loop (PLL) 10 operating at a relatively low band (e.g., baseband), to stably tune the output frequency $f_O$ of the synthesizer in accordance with a precision reference frequency $f_R$. The reference frequency $f_R$ is subdivided by a divider 12 down to a reduced frequency value $f_\Phi$ associated with baseband operation of the loop's phase detector 14. A second input to the phase detector 14 is obtained by a division by N of the output of a voltage controlled oscillator (VCO) 16 down to the phase detector's operating frequency $f_\Phi$. The control voltage for the VCO is supplied by a loop filter 15 coupled to the output of the phase detector 14.

Division by N of the output of a voltage controlled oscillator (VCO) 16 down to the phase detector's operating frequency $f_{101}$ is typically implemented by coupling the output frequency $f_O$ to a first (divide-by-N1) frequency divider 17, which is coupled in cascade with a second (divide-by-N2) frequency divider 18 within the phase locked loop 10. The first frequency divider 17 provides a relatively coarse division of the output frequency $f_O$ down to a value that may be incrementally further divided in 'tuning' steps associated with the adjustment of the synthesizers's output frequency provided by the PLL's internal divider 18. The composite division of the output frequency $f_O$ by divisors N1 and N2 is reflected in a complementary multiplication of the phase noise by the output voltage from the phase detector 14 which drives the VCO 16 in accordance with the relationship 20logN. This means that as the output frequency increases and the step size decreases, N and therefore phase noise degradation will increase.

One way to reduce the value of N is to install analog signal-based down-conversion components in the feedback path from the VCO through the divider components to the phase detector. This serves to provide a precursor reduction in frequency of the signal fed back to the phase locked loop from the output of the VCO, so that the overall magnitude of the divisor N may be reduced, and thereby decrease the phase noise multiplication figure defined by 20logN. This precursor analog-based downconversion technique is shown diagrammatically in FIG. 2, wherein the output of the VCO 16 is multiplied by a local oscillator signal $f_{LO}$ in a mixer 21, to produce an intermediate frequency signal $f_I$. This intermediate frequency $f_I$ is then filtered in a band pass filter 23 and coupled through the frequency divider 17 to the internal frequency divider 18 of the PLL 10.

Because the input frequency $f_I$ to the frequency divider 17 is lower than that ($f_O$) in the architecture of FIG. 1, the overall or composite magnitude N' of the cascaded frequency dividers 17 and 18 may be smaller than that of FIG. 1. This means that the resultant phase noise multiplication value of 20logN' of the architecture of FIG. 1 is smaller than the value of 20logN, so that a reduction in phase noise degradation relative to the scheme of FIG. 1 is realized. However, for proper operation, the analog architecture of FIG. 2 requires extremely high precision and low leakage analog downconverter components, which increases complexity and cost.

SUMMARY OF THE INVENTION

In accordance with the present invention, both the fundamental phase noise multiplication problem of the architecture of FIG. 1 and the cost of implementation problem of the analog down-conversion scheme of FIG. 2 are substantially mitigated by replacing the frequency division components of the feedback paths of the architectures of FIGS. 1 and 2 with a subsampled analog-to-digital converter. By clocking the analog-to-digital converter at a subsampling frequency which has a subharmonic relationship with the output frequency of the VCO, two benefits are obtained.

First, the subsampling digitizing operation performs 'constructive aliasing' of the oscillator output frequency, so that at some value of the subharmonic ratio, the Nyquist window of the convolved output of the digitizer includes the baseband reference frequency $f_\Phi$ for the phase locked loop. Secondly, the digitally controlled synthesizer's phase locked loop uses digital components for tuning control, so that no additional phase noise division is employed. This means that only the value of the subsampling ratio 'n' of the subsampling clock to the analog-to-digital converter will determine the magnitude of the multiplicative phase noise error (20logn).

In accordance with a non-limiting example of a quadrature channel-based phase locked loop, a precision reference frequency signal is coupled to a processor-controlled baseband oscillator, which produces in-phase (I) and quadrature-phase (Q) reference frequency step-controlling components that are applied to respective in-phase and quadrature channels of a quadrature phase detector, within a digitally controlled phase locked loop. The use of a digitally controlled phase locked loop enables the stepsize of the synthesizer output to be controlled in very refined (sub-Hertz) values.

I and Q channels of the quadrature phase detector are also coupled to the output of a subsampled analog-to-digital converter, to which the output frequency of a (voltage or current) controlled oscillator that produces the synthesizer's output frequency is coupled. The outputs of the I and Q channels of the quadrature phase detector are coupled through respective digital low pass filters to a phase error generator, which outputs a phase error signal. The phase error signal is coupled through a digital loop filter to a digital-to-analog converter, the analog output of which sets the output frequency of the controlled oscillator and thereby the synthesizer.

DETAILED DESCRIPTION

Figure 1:
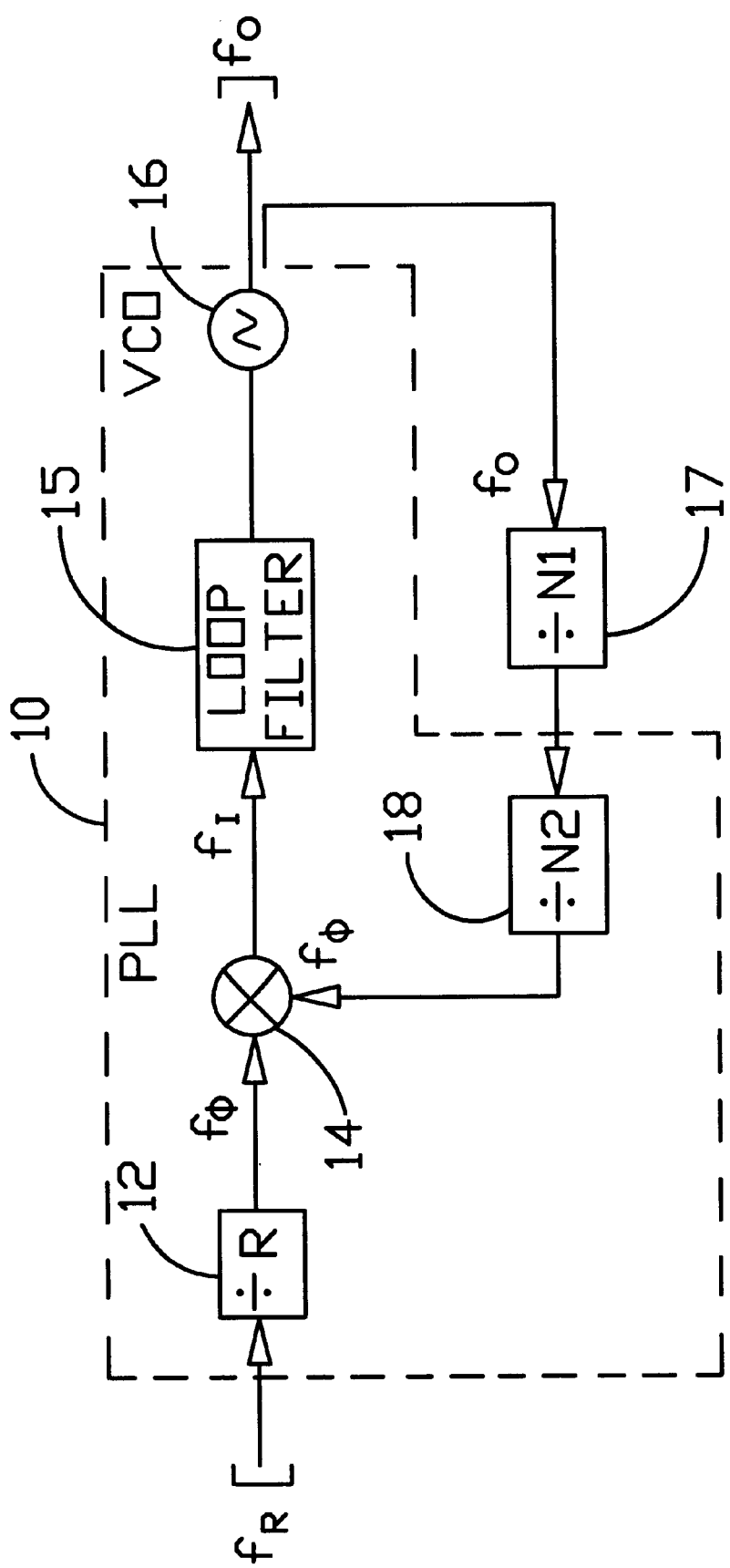
FIG. 1 diagrammatically illustrates a conventional frequency synthesizer that employs a baseband phase locked loop.
Figure 2:
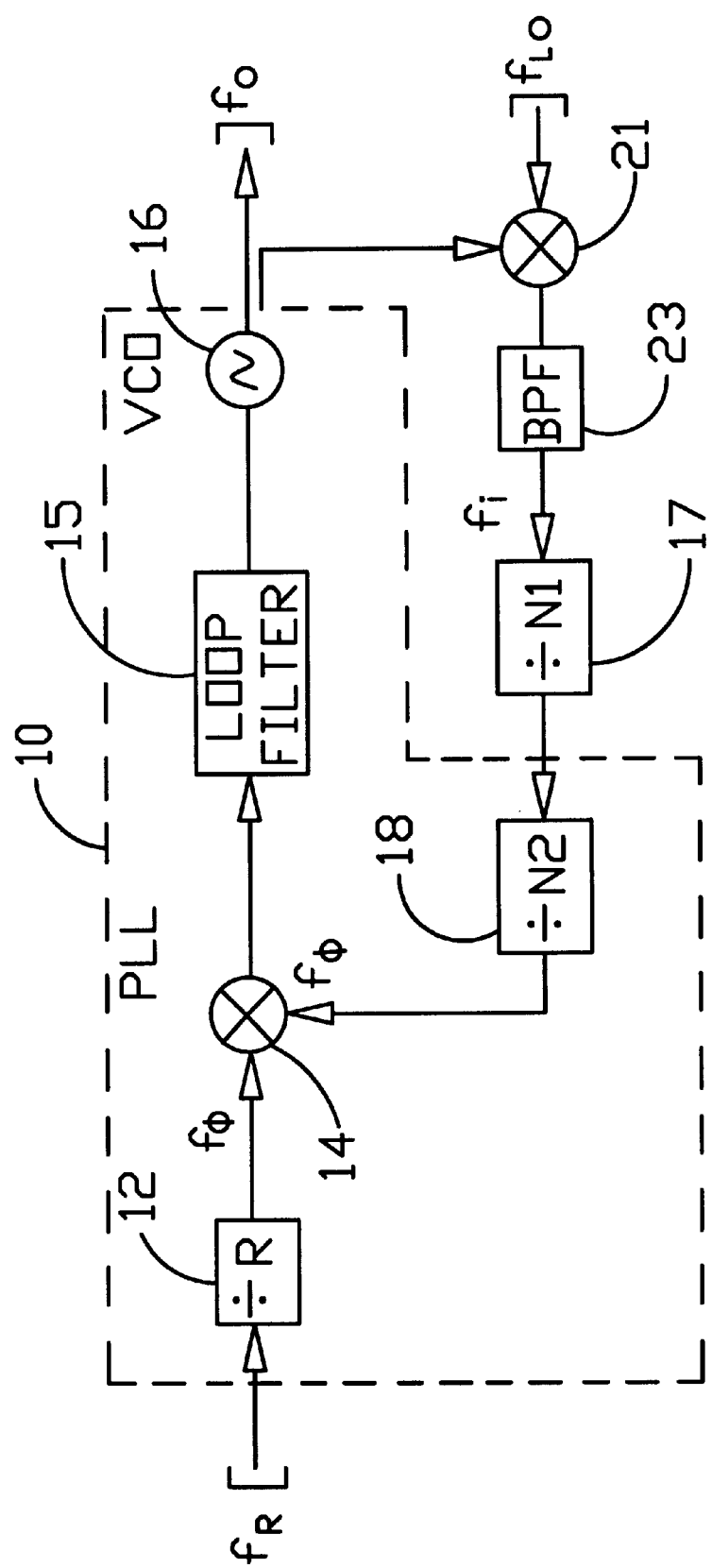
FIG. 2 shows a modification of the frequency synthesizer of FIG. 1 to incorporate analog signal-based down-conversion components in the feedback path from the VCO to reduce the frequency input to the divider stages of the phase locked loop.

Before describing in detail the subsampling digitizer-based frequency synthesizer in accordance with the present invention, it should be observed that the present invention resides primarily in what is effectively a prescribed arrangement of conventional analog and digital communication circuits and components, and not in the details of such components. Consequently, the configuration of such circuits and components, and the manner in which they may be interfaced with other communication equipment have, for the most part, been illustrated in the drawings by a readily understandable block diagram, which shows only those specific details that are pertinent to the present invention, so as not to obscure the disclosure with details which will be readily apparent to those skilled in the art having the benefit of the description herein. Thus, the block diagram illustration is primarily intended to show the major components of the frequency synthesizer in a convenient functional grouping, whereby the present invention may be more readily understood.

Figure 3:
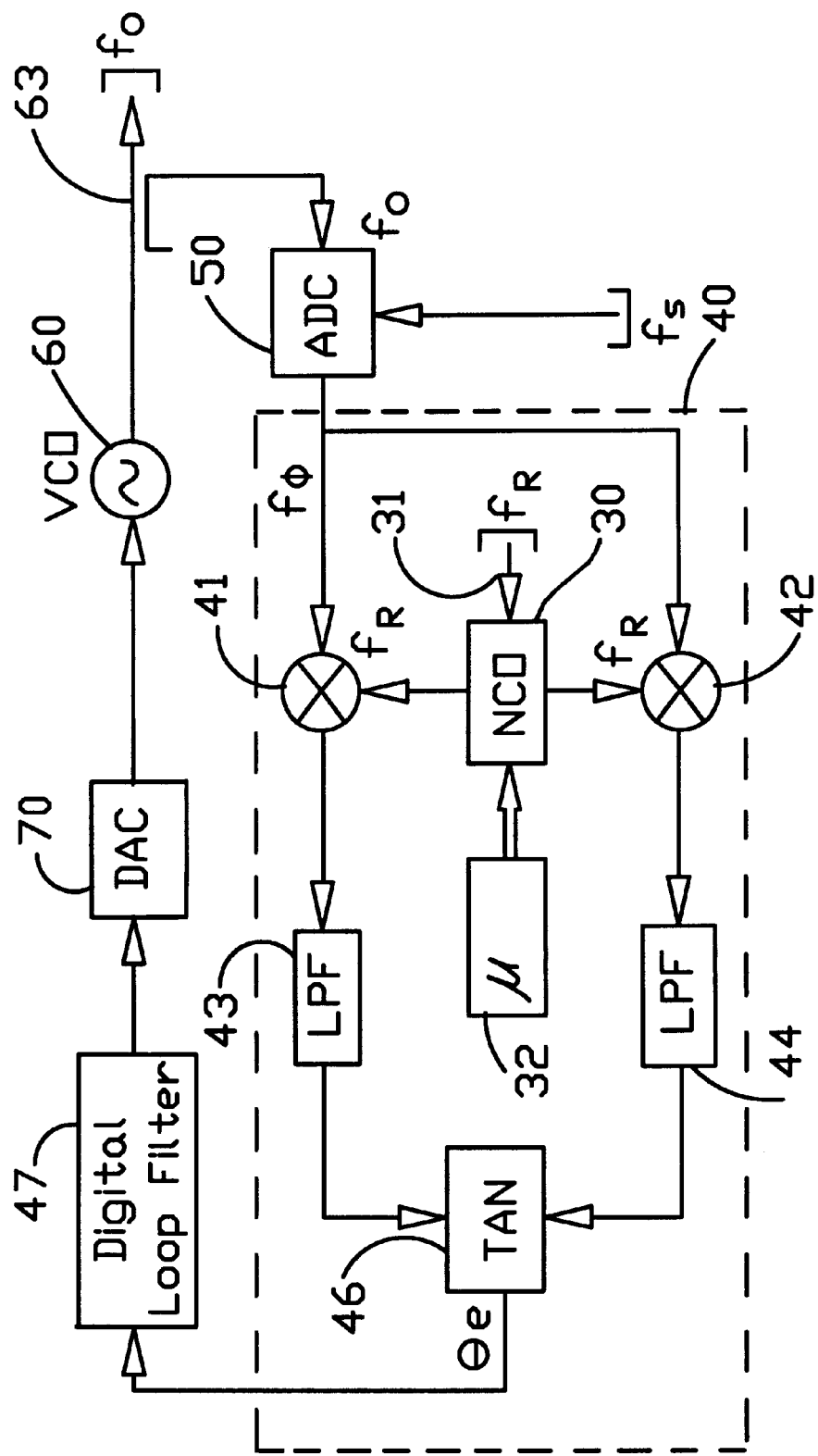
FIG. 3 diagrammatically illustrates a subsampling digitizer-based frequency synthesizer in accordance with the present invention.

Referring now to FIG. 3, a non-limiting example of a subsampling digitizer-based frequency synthesizer in accordance with the present invention is diagrammatically illustrated as comprising an input port 31 to which a precision reference frequency signal $f_R$ used to establish the operation frequency of the synthesizer is applied. For the non-limiting example of using a quadrature-based digitally implemented phase detector to produce a phase error signal for controlling the operation of the phase locked loop, the input port 31 is coupled to a numerically controlled digital baseband oscillator 30. Under the control of an associated microcontroller 32, oscillator 30 outputs respective in-phase (I) and quadrature-phase (Q) reference frequency step-controlling components $f_{RI}$ and $f_{RQ}$. As described briefly above, the use of a digitally controlled phase locked loop readily enables the stepsize of the synthesizer output to be varied as desired to very refined (e.g., sub-Hertz) values.

The two relative quadrature reference frequency components $f_{RI}$ and $f_{RQ}$ supplied by the numerically controlled baseband oscillator 30 are coupled to respective I and Q channel digital mixers 41 and 42 of a quadrature based digital phase detector 40, all of the components of which are implemented as digital circuits, as described. The I and Q channel digital mixers 41 and 42 are further coupled to receive the output of an analog-to-digital converter (ADC) 50, to which the output of a (current or voltage) controlled oscillator 60 is coupled. The output of the controlled oscillator 60 is coupled to an output port 63, from which a synthesizer output frequency signal $f_O$, that is proportional to a tunable multiple of the reference frequency $f_R$, is derived.

Figure 4:
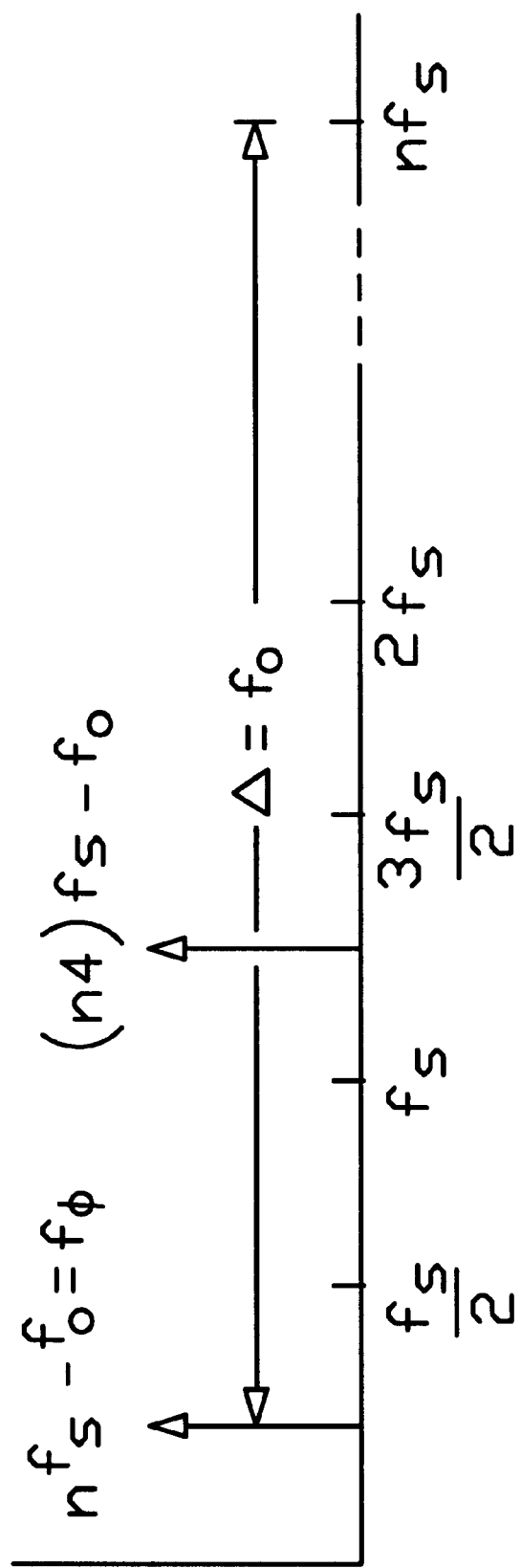
FIG. 4 shows the convolved output of the subsampled digitizer of the frequency synthesizer of FIG. 3.

As pointed out briefly above, the ADC 50 is clocked by a subsampling clock signal having a frequency $f_s$, which has a subharmonic relationship to the frequency generated by the controlled oscillator 60. Consequently, the ADC 50 effectively performs 'constructive aliasing' of its input frequency, which corresponds to the frequency $f_O$. FIG. 4 shows the convolved output of subsampled ADC 50 containing a plurality of subharmonic frequency image pairs $f_O$, $-f_O$, $(f_s+f_O)$, $(f_s-f_O)$; $(2f_s+f_O)$, $(2f_s-f_O)$; ... , $(nf_s+f_O)$, $(nf_s-f_O)$, $((n+1)f_s+f_O)$, $((n+1)f_s-f_O)$, .... To avoid cluttering the drawing FIG. 4 does not show negative frequencies and their associated reflected images, which are also included in the convolved output of ADC 50. The value of n and therefore the harmonic of the sampling frequency $f_s$ is determined by the undersampling ratio; namely, n=1 for $f_s/2 < f_O < 3f_s/2$; n=2 for $3f_s/2 < f_O < 5f_s/2$; n=3 for $5f_s/2 < f_O < 7f_s/2$, etc.

At some value of n, the Nyquist window of the convolved output of the ADC 50 will contain the baseband reference frequency $f_R$ for the phase locked loop. As noted earlier, since the synthesizer's phase locked loop uses digital components for tuning control (e.g., down to increments of a fraction of a Hz), no additional loop-internal frequency divider is required. Therefore, it is only the value of the subsampling ratio 'n' that defines the magnitude 20logn of the multiplicative phase noise error in the synthesized output frequency $f_O$.

The magnitude of n will depend upon the sampling frequency $f_s$. The higher the sampling frequency, the lower the value of n, and therefore the smaller the phase noise multiplication. However, there is a cost associated with a lower sampling clock. The choice of sampling clock involves a trade-off between component cost and performance. In order to improve the phase noise performance by six dB, it is necessary to double the sampling clock rate, i.e., decrease 'n' by a factor of two. Where the synthesizer is intended for use at relatively high output frequencies, it can be expected that the cost associated with the higher phase noise performance may be directly attributable to the increased cost of a sampling clock whose waveform is sufficiently 'clean' for proper digitizer operation.

The outputs of the I and Q channel digital mixers 41 and 42 of the digital phase detector 40 are coupled through respective digital low pass filters 43 and 44 to a phase error generator 46, which outputs a digital phase error representative signal $\theta_e$. This phase error signal $\theta_e$ is coupled through a digital loop filter 47 to a digital-to-analog converter (DAC) 70, which produces an output (i.e., voltage or current), the magnitude of which sets the output frequency $f_O$ of the controlled oscillator 60.

As will be appreciated from the foregoing description, the present invention provides an effective reduction in the phase noise multiplication problem associated with relatively large valued frequency divider stages that are external to and internal of the feedback path of an output controlling phase locked loop of a conventional frequency synthesizer. By replacing the frequency division components of the loops feedback path with an analog-to-digital converter clocked at a (subharmonic) fraction of the output frequency of the VCO, the subsampling digitizing operation simultaneously performs digitization and 'constructive aliasing' of the oscillator's output frequency. Since the digitally controlled synthesizer's phase locked loop uses digital components for tuning control, no additional phase noise division is employed. As a consequence, the multiplicative phase noise error is reduced to only the value of the subsampling ratio 'n' of the subsampling clock to the analog-to-digital converter.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. An apparatus for generating an output frequency signal comprising:

an input port to which a reference frequency signal is applied;

an output port from which said output frequency signal having a tunable multiple of said input frequency is derived;

a subsampling digitizer coupled to said output port and being driven by a subsampling clock signal at a subharmonic fraction of an output frequency of the output frequency signal to produce a digitized frequency signal that has a subharmonic relationship with said output frequency signal; and a digital phase locked loop that is operative to generate said output frequency signal in accordance with a comparison of said digitized frequency signal produced by said subsampling digitizer and a tuning increment of said reference frequency signal.

2. An apparatus according to claim 1, wherein said digital phase locked loop includes a digitally controlled oscillator coupled to said input port and coupled to receive a signal representative of said tuning increment of said reference frequency signal, a phase detector that generates a phase error signal in accordance with said comparison of said digitized frequency signal produced by said subsampling digitizer and a tuning increment of said reference frequency signal, and a controlled oscillator coupled to generate said output frequency signal in accordance with said phase error signal.

3. A method for generating an output frequency signal comprising the steps of:

(a) generating a reference frequency signal; and (b) generating said output frequency signal as a function of said reference frequency signal by (b1) digitizing said output frequency signal by way of a subsampling digitizer driven by a subsampling clock signal at a subharmonic fraction of an output frequency of the output frequency signal to produce a digitized frequency signal that has a subharmonic relationship with said output frequency signal, and (b2) coupling said reference frequency signal and said digitized frequency signal to a digital phase locked loop that is operative to generate said output frequency signal in accordance with a comparison of said digitized frequency signal produced by said subsampling digitizer and a tuning increment of said reference frequency signal.

4. A method according to claim 3, wherein said digital phase locked loop of step (b1) includes a digitally controlled oscillator that is coupled to receive said reference frequency signal and a signal representative of said tuning increment of said reference frequency signal, a phase detector that generates a phase error signal in accordance with said comparison of said digitized frequency signal produced by said subsampling digitizer and a tuning increment of said reference frequency signal, and a controlled oscillator coupled to generate said output frequency signal in accordance with said phase error signal.

5. A frequency synthesizer comprising:

an input port to which a precision reference frequency signal $f_R$ used to establish the operation frequency of the synthesizer is applied;

a quadrature based digital phase locked loop that includes a numerically driven digital baseband oscillator, which is operative to couple respective in-phase (I) and quadrature-phase (Q) reference frequency step-controlling components $f_{RI}$ and $f_{RQ}$ to respective I and Q channel digital mixers in accordance with said precision reference frequency signal $f_R$, said respective I and Q channel digital mixers being coupled to receive the output of an analog-to-digital converter to which an input frequency $f_O$ corresponding to the output frequency $f_O$ of a controlled output oscillator is coupled, and being coupled to a phase error generator, which outputs a digital phase error representative signal $\theta_e$ to said output frequency $f_O$ of said controlled oscillator, said controlled oscillator having an output port from which said output frequency signal $f_O$ that is a tunable multiple of said reference frequency $f_R$ is derived; and a subsampling clock coupled to clock said analog-to-digital converter at a subsampling clock frequency $f_s$ that is subharmonically related to its input frequency $f_O$, so that said analog-to-digital converter effectively performs 'constructive aliasing' of said input frequency $f_O$, to produce a digitized frequency signal that is subharmonically related to said input frequency $f_O$.

\* \* \* \* \*